United States Patent [19]

Takizawa

[11] Patent Number: 5,235,220
[45] Date of Patent: Aug. 10, 1993

[54] MAJORITY DECISION METHOD AND CIRCUIT WHEREIN LEAST POSSIBLE FLIP-FLOPS ARE USED

[75] Inventor: Hiroshi Takizawa, Tokyo, Japan

[73] Assignee: NEC Corporation, Tokyo, Japan

[21] Appl. No.: 760,314

[22] Filed: Sep. 16, 1991

[30] Foreign Application Priority Data

Sep. 14, 1990 [JP]  Japan .................................. 2-24594

[51] Int. Cl.[5] .......................................... H03K 19/23
[52] U.S. Cl. ....................................... 307/464; 371/36; 371/69.1
[58] Field of Search ................. 307/464; 371/36, 69.1

[56] References Cited

U.S. PATENT DOCUMENTS

| | | | |
|---|---|---|---|
| 4,132,975 | 1/1979 | Koike | 371/69.1 |
| 4,400,811 | 8/1983 | Brown et al. | 371/69.1 |
| 4,404,677 | 9/1983 | Grande et al. | 371/69.1 |
| 4,852,105 | 6/1989 | Kurz | 371/69.1 |
| 4,959,836 | 9/1990 | Berard et al. | 371/69.1 |

Primary Examiner—Edward P. Westin
Assistant Examiner—Andrew Sanders
Attorney, Agent, or Firm—Sughrue, Mion, Zinn Macpeak & Seas

[57] ABSTRACT

On determining an entire majority of five i-th received data bits which correspond to an i-th original data bit repeatedly received five times, first through I-th received data bits of a first received frame are stored in a main buffer (41) as first through I-th memorized data bits. A first partial majority is determined as regards two data bits, the i-th memorized data bit and an i-th received data bit of a second received frame. When the two data bits are and are not identical, first and second logic values are stored in an auxiliary buffer (42) as an i-th auxiliary data bit. Second and third partial majorities are successively determined by using the memorized and the auxiliary data bits. Likewise determined, a fourth partial majority gives the entire majority. When an original frame is repeatedly received more than five times, first through (N−1)-th counter buffers are substituted for the auxiliary buffer to memorize first through I-th memorized counts for use together with the memorized data bits in successively determining partial majorities of the type described.

8 Claims, 3 Drawing Sheets

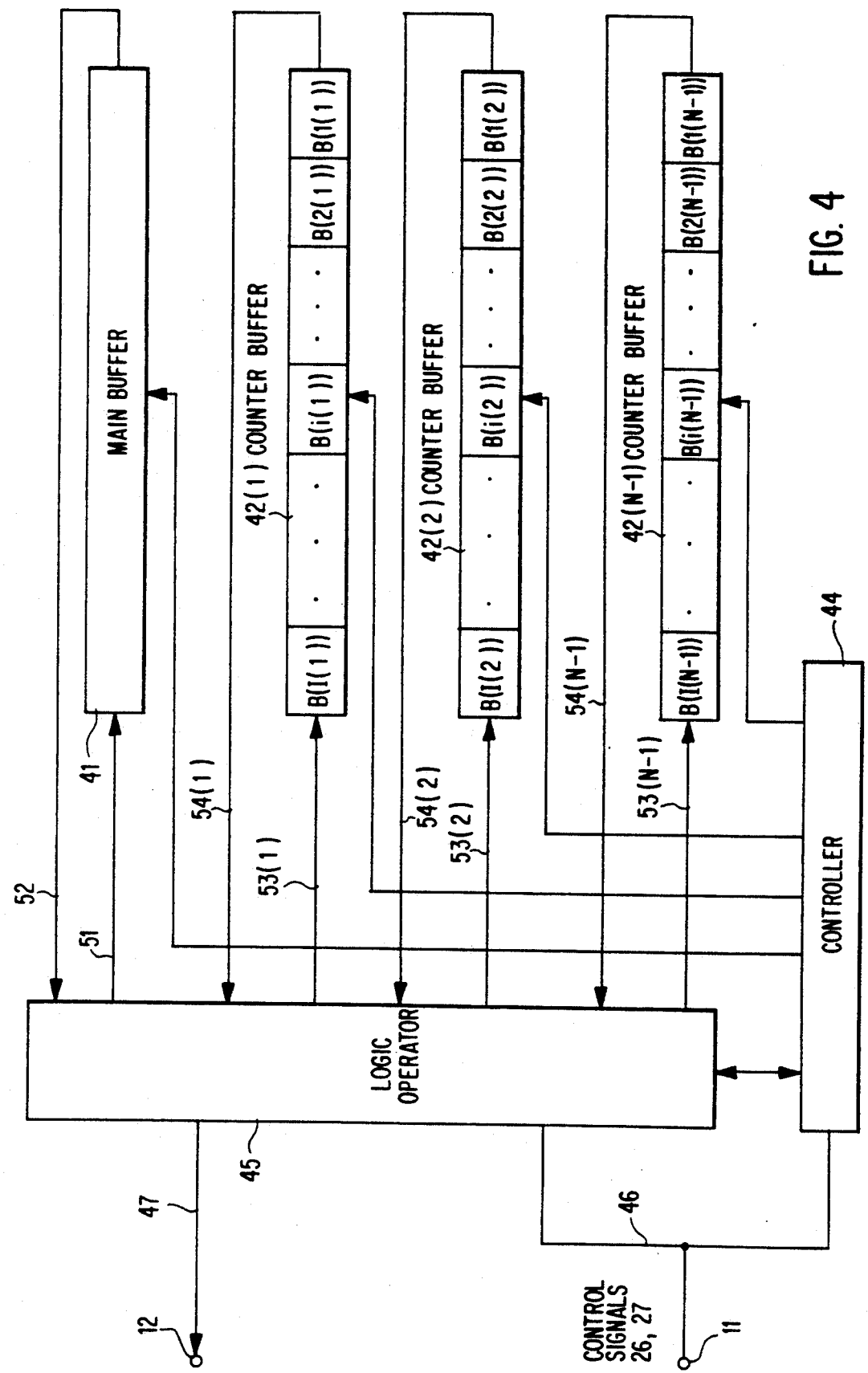

MAJORITY DECISION METHOD AND CIRCUIT WHEREIN LEAST POSSIBLE FLIP-FLOPS ARE USED

BACKGROUND OF THE INVENTION

This invention relates to a majority decision method and a majority decision circuit for use in a receiver circuit to which an original frame is transmitted from a transmitter circuit through a channel susceptible to disturbances. Such a majority decision circuit is indispensable in, for example, an automobile digital communication network in which the original frame is repeatedly transmitted either five times or eleven times. The original frame comprises a plurality of original data or information bits.

More in general, the majority decision circuit receives the original frame an odd predetermined number of times as successively received frames, each comprising received data bits in correspondence to the respective original data bits and consequently to the received data bits of any one of others of the received frames, respectively, and is for determining a majority of the received data bits in each set, which received data bits are in correspondence to each other in the successively received frames. Such a majority is determined in order to provide a resultant frame comprising resultant data bits which are in correspondence to the respective original data bits and therefore to the received data bits of each received frame, respectively, and are best possible reproductions of the original data bits.

In the manner which will later be described more in detail, the majority is determined according to prior art after the successively received frames are all received. This has made it inevitable to use a great number of flip-flops and consequently an enormous number of transistors. The majority is referred to as an entire majority depending on the circumstances.

A conventional majority decision circuit comprises a plurality of buffers for memorizing the received data bits of the respective received frames. A logic operation unit is connected to the buffers and is used in successively determining the majority of the received data bits memorized in the buffers as a set of corresponding data bits of the respective received frames. The data bits in each received frame are, for example, eighty in number. When the received frames are five in number, the buffers must be composed of as many as four hundred flip-flops. Each flip-flop comprises from twenty to thirty transistors if implemented by an integrated circuit (IC). The conventional majority decision circuit has therefore had to comprise about ten thousand transistors.

SUMMARY OF THE INVENTION

It is therefore an object of the present invention to provide a majority decision method and a majority decision circuit wherein only a least possible number of flip-flops are necessary.

It is another object of this invention to provide a majority decision method and a majority decision circuit which are of the type described and in which only a least possible number of transistors are used.

Other objects of this invention will become clear as the description proceeds.

On describing the gist of an aspect of this invention, it is possible to understand that a majority decision method is for determining, by receiving an odd predetermined number of successively received frames, each comprising received data bits in correspondence to the received data bits of another of the successively received frames, respectively, an entire majority of the received data bits of each entire set, the received data bits of the entire set being in correspondence to each other in the successively received frames.

According to the above-mentioned aspect of this invention, the above-understood majority decision method comprises the step of determining the entire majority while successively receiving the received frames.

Preferably, the above-described majority decision method is used when the predetermined number is not less than five and when the successively received frames consist of first, second, and third through M-th received frames, where M represents the predetermined number.

Under the circumstances, the entire majority determining step comprises the steps of: (A) determining, while the second received frame is currently received following the first received frame, a first partial majority of the received data bits of each first partial set, the received data bits of the first partial set being in correspondence to each other in the first and the second received frames; and (B) determining, while an m-th received frame is currently received, where m consecutively increases from three to the predetermined number, both inclusive, an $(m-1)$-th partial majority of the first partial majority and the received data bits of an $(m-1)$-th partial set, the received data bits of the $(m-1)$-th partial set being in correspondence to the received data bits of the first partial set in the third through the m-th received frames, the $(m-1)$-th partial majority becoming the entire majority when m becomes equal to the predetermined number.

On describing the gist of a different aspect of this invention, it is possible to understand that a majority decision circuit is for repeatedly receiving an original frame comprising original data bits as first, second, and third through M-th received frames, each comprising received data bits in correspondence to the original data bits, respectively, where M represents the predetermined number and is not less than five. This majority decision circuit is for producing a resultant frame comprising resultant data bits in correspondence to the original data bits, respectively.

According to the different aspect of this invention, the above-understood majority decision circuit comprises: (A) first majority determining means supplied with the first and the second received frames for determining a first partial majority of the received data bits of each first partial set, the received data bits of the first partial set being in correspondence to each other in the first and the second received frames; and (B) second majority determining means connected to the first majority determining means and supplied with an m-th received frame of the third through the M-th received frames for determining an $(m-1)$-th partial majority of the first partial majority and the received data bits of an $(m-1)$-th partial set, the received data bits of the $(m-1)$-th partial set being in correspondence to the received data bits of the first partial set in the third through the m-th received frames, where m consecutively increases from three to the predetermined number, both inclusive, the $(m-1)$-th partial majority giving one of the resultant data bits when m becomes equal to the predetermined number, the above-mentioned one of the resultant data bits being in correspondence to each of the received data bits of the (m−1)-th partial set.

On describing the gist of a further different aspect of this invention, it is possible to understand that a majority decision circuit is for repeatedly receiving five times an original frame comprising original data bits as successively received frames, each comprising received data bits in correspondence to the original data bits, respectively, and for producing a resultant frame comprising resultant data bits in correspondence to the original data bits, respectively.

According to the further different aspect of this invention, the above-understood majority decision circuit comprises: (A) a main buffer for memorizing memorized data bits in correspondence to the original data bits, respectively; (B) an auxiliary buffer for memorizing auxiliary memorized bits in correspondence to the original data bits, respectively; and (C) logic operation means connected to the main and the auxiliary buffers and supplied with the successively received frames for carrying out a logic operation on the memorized data bits and the auxiliary memorized bits; by (a) determining a majority of each of the memorized data bits and from one to five of the received data bits of each set to update the said each of the memorized data bits to the majority, the above-mentioned from one to five of the received data bits of the set being in correspondence in the successively received frames to the said each of the memorized data bits; by (b) giving first and second logic values to each of the auxiliary memorized bits when two of the said from one to five of the received data bits are identical with each other and otherwise, respectively, while only two of the successively received frames are received and when at least three of the said from one to five of the received data bits are identical with one another and otherwise, respectively, while more than two of the successively received frames are received, the said each of the auxiliary memorized bits being in correspondence to the said each of the memorized data bits; and by (c) using the memorized data bits and the auxiliary memorized bits in eventually updating the memorized data bits to the resultant data bits when supplied with all of the successively received frames.

Preferably, the above-described majority decision circuit is used (a) when the successively received frames consist of first, second, third, fourth, and fifth received frames, (b) when the received data bits of each of the first through the fifth received frames consist of first through I-th received data bits, where I represents a predetermined integer, (d) when the memorized data bits consist of first through I-th memorized data bits, and (e) when the auxiliary memorized bits consist of first through I-th auxiliary memorized bits.

Under the circumstances, the logic operation means may comprise: (A) value giving means connected to the main buffer and supplied with the first received frame for giving the first through the I-th received data bits of the first received frame to the first through the I-th memorized data bits; (Ba) first value giving means connected to the main and the auxiliary buffers and supplied with the second received frame for giving, when an i(1)-th received data bit of the second received frame is and is not identical with an i(1)-th previous data bit had by an i(1)-th memorized data bit immediately before the second received frame is received, the first and the second logic values to an i(1)-th auxiliary memorized bit, respectively, where i(1) is variable between 1 and the predetermined integer, both inclusive; (Bb) second value giving means connected to the main and the auxiliary buffers and supplied with the third received frame for giving, when an i(2)-th received data bit of the third received frame is not identical with an i(2)-th previous data bit and furthermore when the first logic value is had by an i(2)-th auxiliary memorized bit, the second logic value to the i(2)-th auxiliary memorized bit and the i(2)-th received data bit to an i(2)-th memorized data bit, where i(2) is variable between 1 and the predetermined integer, both inclusive, the i(2)-th previous data bit being had by the i(2)-th memorized data bit immediately before the third received frame is received; (Bc) third value giving means connected to the main and the auxiliary buffers and supplied with the fourth received frame for giving, when an i(3)-th received data bit of the fourth received frame is identical with an i(3)-th previous data bit had by an i(3)-th memorized data bit immediately before the fourth received frame is received, the first logic value to an i(3)-th auxiliary memorized bit, where i(3) is variable between 1 and the predetermined integer, both inclusive; and (Bd) fourth value giving means connected to the main and the auxiliary buffers and supplied with the fifth received frame for giving, when an i(4)-th received data bit of the fifth received frame is not identical with an i(4)-th previous data bit and furthermore when the first logic value is had by an i(4)-th auxiliary memorized bit, the i(4)-th received data bit to an i(4)-th memorized data bit, where i(4) is variable between 1 and the predetermined integer, both inclusive, the i(4)-th previous data bit being had by the i(4)-th memorized data bit immediately before the fifth received frame is received, the fourth value giving means being for giving the first through the I-th resultant data bits by the first through the I-th memorized data bits which are updated by using the first through the I-th received data bits of the fifth received frame.

On describing the gist of a still further different aspect of this invention, it is possible to understand that a majority decision circuit is for repeatedly receiving an odd predetermined number of times an original frame comprising original data bits as first, second, and subsequently received frames, each comprising first through I-th received data bits in correspondence to the original data bits, respectively, where I represents a first predetermined integer which is greater than the odd predetermined number. This majority decision circuit is for producing a resultant frame comprising first through I-th resultant data bits in correspondence to the original data bits, respectively.

According to the still further different aspect of this invention, the above-understood majority decision circuit comprises: (A) a main buffer for memorizing first through I-th memorized data bits in correspondence to the original data bits, respectively; (B) first through (N−1)-th counter buffers, an n-th counter buffer being for memorizing first through I-th count bits in correspondence to the original data bits, respectively, where N represents a second predetermined integer which is greater than two, n consecutively increasing from one to the second predetermined integer less one, the odd predetermined number being not greater than $(2^{(N+1)}-3)$, i-th count bits of the first through the (N−1)-th counter buffers collectively representing an i-th memorized count among first through I-th memorized counts, where i is variable between 1 and the first predetermined integer, both inclusive; (C) value giving means connected to the main and the first through the (N−1)-th counter buffers and supplied with the first received frame for giving the first through the I-th received data bits of the first received frame to the first through the I-th memorized data bits and an initial count to each of the first through the I-th memorized counts; and (D) a logic operation unit connected to the main and the first through the (N−1)-th counter buffers and supplied with the second and the subsequently received frames for carrying out a logic operation on the first through the I-th memorized data bits and the first through the I-th memorized counts to determine, while supplied with an n-th received frame of the second and the subsequently received frames, a majority of n i-th received data bits of the first through the n-th received frames; by (a) giving, while supplied with the second received frame, an i-th received data bit of the second received frame to an i-th memorized data bit and the initial count plus one to an i-th memorized count only when the i-th received data bit of the second received frame is not identical with an i-th received data bit of the first received frame; by (b) updating, while supplied with an odd-numbered frame of the subsequently received frames as the n-th received frame, and i-th previous count to the i-th previous count minus one only when an i-th received data bit of the n-th received frame is not identical with an i-th previous data bit and furthermore only when the initial count is had by the i-th previous count, the i-th previous count being had by the i-th memorized count immediately before the n-th received frame is received, the i-th previous data bit being had by the i-th memorized data bit immediately before the n-th received frame is received; by (c) updating, while supplied with an even-numbered frame of the subsequently received frames as the n-th received frame, the i-th previous count to the i-th previous count plus one only when the i-th received data bit of the n-th received frame is identical with the i-th previous data bit and furthermore only when a common maximum of the first through the I-th memorized counts is not had by the i-th previous count; by (d) updating, while supplied with whichever of the odd-numbered and the even-numbered frames as the n-th received frame, the i-th previous data bit to the i-th received data bit of the n-th received frame only when the initial count is had by the i-th previous count; and by (e) using the first through the I-th memorized data bits and the first through the I-th memorized counts in eventually updating the first through the I-th memorized data bits to the first through the I-th resultant data bits when supplied with all of the subsequently received frames.

BRIEF DESCRIPTION OF THE DRAWING

FIG. 4 is a block diagram of a majority decision circuit according to a second embodiment of this invention.

DESCRIPTION OF THE PREFERRED EMBODIMENTS

Figure 1:
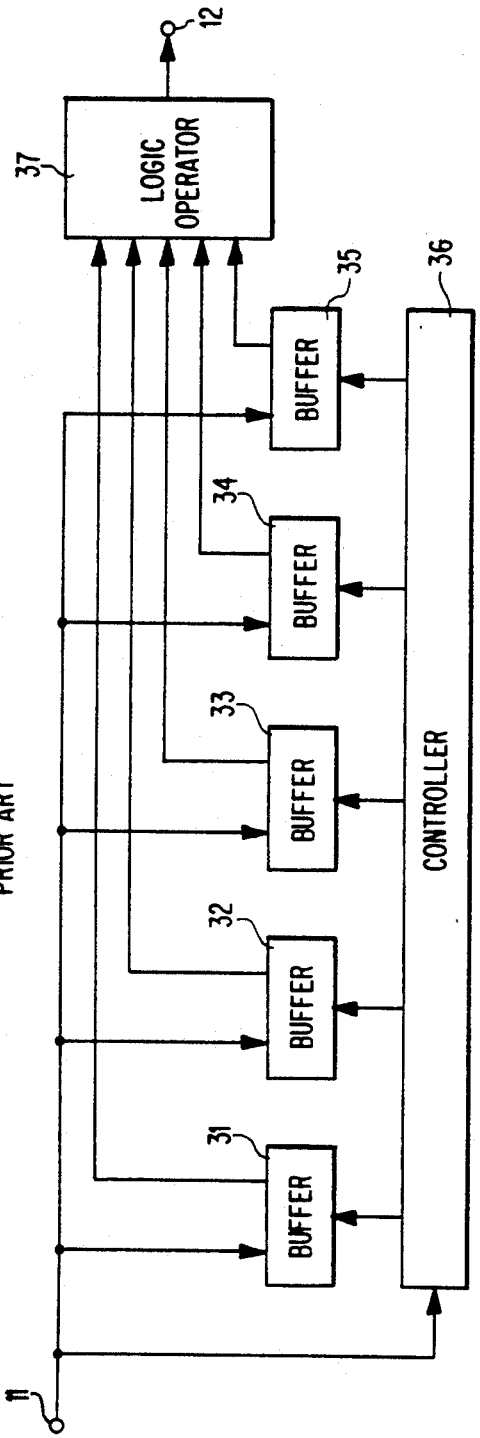
FIG. 1 is a block diagram of a conventional majority decision circuit.

Referring to FIG. 1, a conventional majority decision circuit will first be described in order to facilitate an understanding of the present invention. Such a majority decision circuit is useful in a receiver circuit to which an original frame is transmitted from a transmitter circuit through a channel which is susceptible to disturbances. The original frame comprises a plurality of original data or information bits. The majority decision circuit is indispensable in an automobile digital communication network in which the original frame is repeatedly transmitted either five times or eleven times. Speaking more in general, the majority decision circuit is for receiving the original frame M times, where M represents an odd predetermined number which is not less than five.

In FIG. 1, the majority decision circuit has circuit input and output terminals 11 and 12. The original frame is received M times at the circuit input terminal 11 as successively received frames, each comprising received data bits in correspondence to the respective original data bits. Determining a majority of the received data bits of each set of corresponding data bits of the successively received frames in the manner which will presently be described in detail, the majority decision circuit supplies the circuit output terminal 12 with a resultant frame which comprises resultant data bits in correspondence to the respective received data bits of each of the successively received frames and consequently to the respective original data bits. The resultant frame gives a best possible reproduction of the original frame. The majority will be called an entire majority depending on the circumstances.

Figure 2:
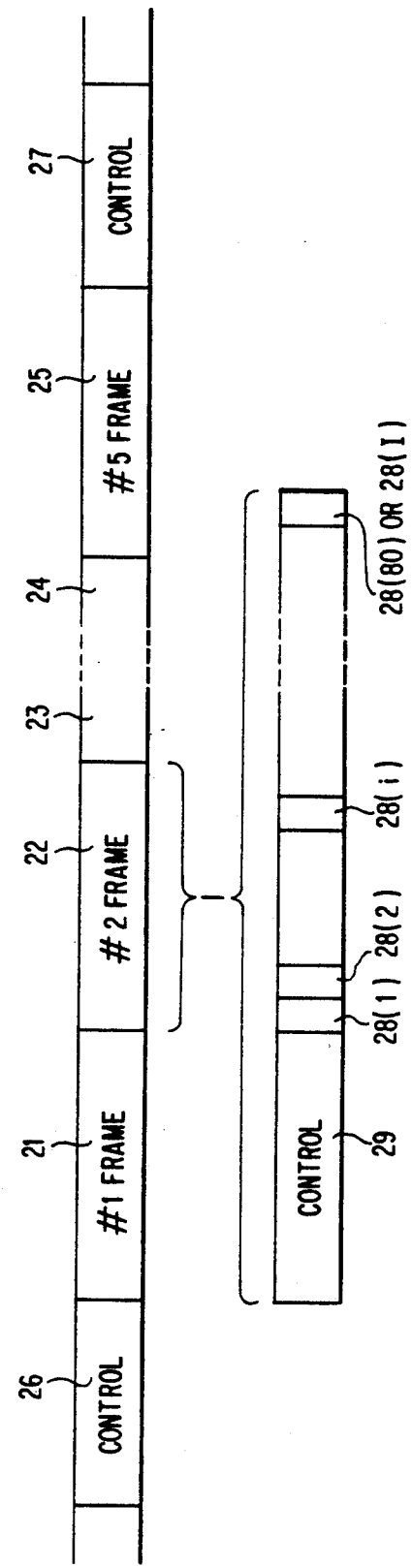
FIG. 2 shows a format of a signal which comprises five successively received frames used in an automobile digital communication network.

Turning to FIG. 2 during a short while, the successively received frames consist of first through fifth received frames 21, 22, 23, 24, and 25. Control data 26 and 27 are received preceding and succeeding the five successively received frames 21 through 25. Each of the frames 21 to 25 comprises first through eightieth received data bits 28(1), 28(2), . . . , and 28(80) and a control datum 29. More in general, each of the first through M-th received frames comprises first through I-th received data bits 28(1), 28(2), . . . , 28(i), . . . , and 28(I), where I represents a first predetermined integer which is greater than the predetermined number M, i being variable between 1 and the predetermined integer, both inclusive. This applies to the original frame and to the resultant frame.

Turning back to FIG. 1, the successively received frames are delivered from the circuit input terminal 11 to first through fifth buffers 31, 32, 33, 34, and 35 and to a controller 36. Using the control data 26, 27, and 29, the controller 36 supplies the first through the fifth received frames to the first through the fifth buffers 31 to 35, respectively. Each of the buffers 31 through 35 is for memorizing first through I-th memorized data bits given by the first through the I-th received data bits, respectively, of one of the first through the fifth received frames that is supplied to the buffer under consideration. The first through the I-th memorized data bits are therefore in correspondence to the first through the I-th original data bits, respectively.

A logic operator 37 is connected to the first through the fifth buffers 31 to 35 and to the controller 36. Controlled by the controller 36, the logic operator 37 reads an i-th memorized data bit at a time from each of the buffers 31 through 35. Reading the i-th memorized data bits from the respective buffers 31 through 35, the logic operator 37 determines an i-th entire majority of the i-th memorized data bits and supplies the majority to the circuit output terminal 12 as an i-th resultant data bit of the resultant frame. Alternatively, the i-th resultant data bit is substituted for the i-th memorized data bit in one of the buffers 31 through 35, such as the first buffer 31.

It is now understood that the logic operator 37 determines the majority by using the received data bits in each set of corresponding data bits, such as the i-th received data bits, of the successively received frames. Such majorities are determined after the first through the fourth received frames are all received and after the fifth received frame is received at least up to the i-th received data bit. What should be noted in this connection is the fact that it is necessary to use the buffers 31 through 35, equal in number to the successively received frames. When the received frames are five in number with each received frame composed of eighty received data bits in the manner exemplified above, the majority decision circuit must comprise as many as four hundred flip-flops and consequently as enormous as about ten thousand transistors if the majority decision circuit should be implemented by an integrated circuit (IC).

From a different point of view, a conventional majority decision method is for determining the majority by using an odd predetermined number, such as five or eleven, of successively received frames, each comprising a plurality of received data bits which are in correspondence to the received data bits of any one of other received frames, respectively. The majority is determined in connection with the received data bits in each set of corresponding data bits, such as the above-exemplified i-th received data bits, of the successively received frames. Inasmuch as the majority is determined by using the buffers 31 through 35, the conventional majority decision method must use a great number of flip-flops and therefore an enormous number of transistors.

Figure 3:
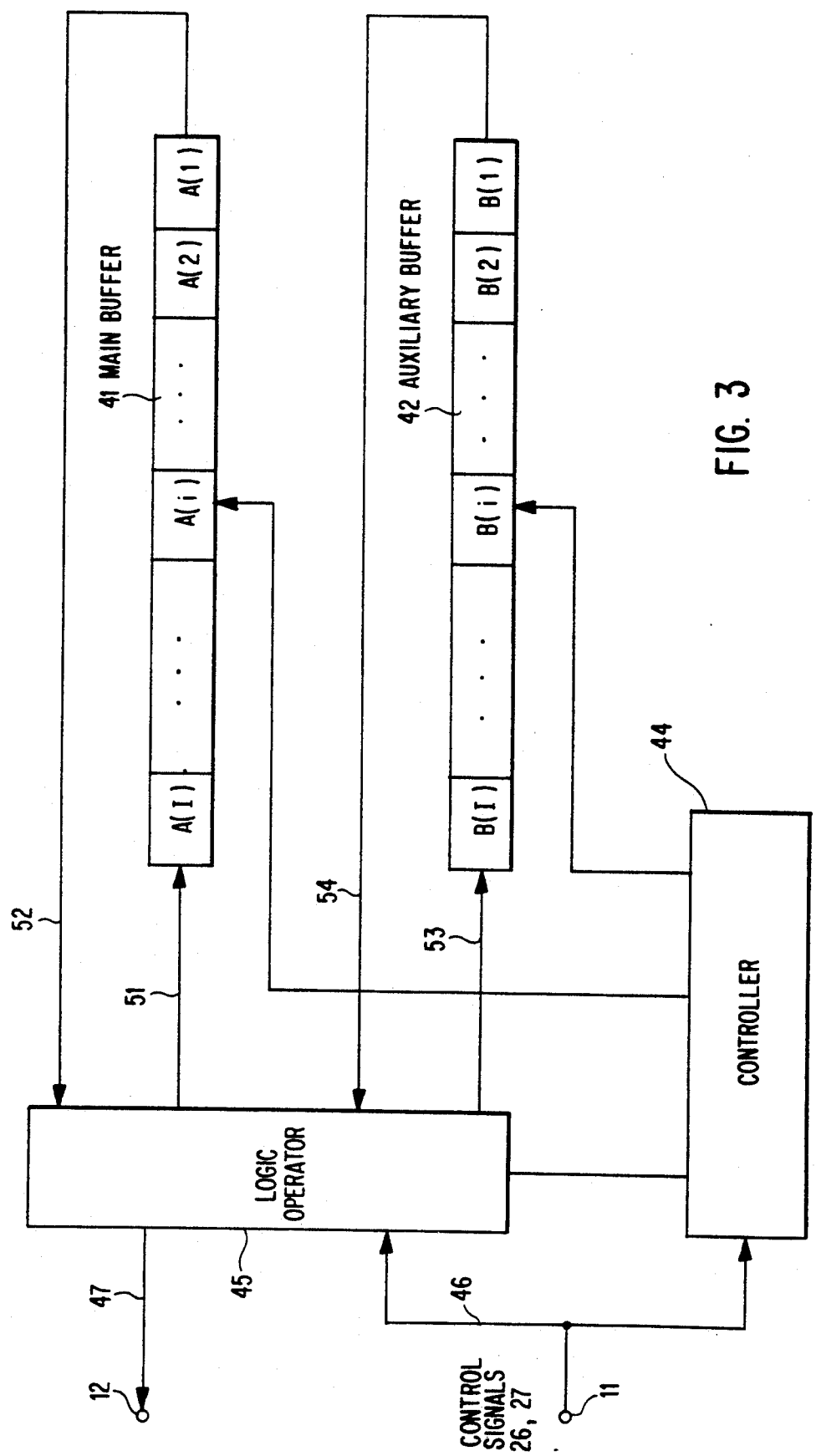
FIG. 3 is a block diagram of a majority decision circuit according to a first embodiment of the instant invention.

Referring now to FIG. 3, the description will proceed to a majority decision circuit according to a first embodiment of this invention. The majority decision circuit has circuit input and output terminals which will be designated by the reference numerals 11 and 12 as above. The majority decision circuit is for dealing with various signals of the type described in conjunction with FIG. 1, such as the original frame, the successively received frames, and the resultant frame. This majority decision circuit is effective when the original frame is repeatedly received five times so that the successively received frames consist of first through fifth received frames, namely, when the odd predetermined number M is equal to five.

In FIG. 3, the majority decision circuit comprises a main buffer 41 for memorizing first through I-th memorized data bits in correspondence to the first through the I-th received data bits of each of the successively received frames, respectively, namely, to the first through the I-th original data bits of the original frame. An auxiliary buffer 42 is for memorizing first through I-th auxiliary memorized bits which are in correspondence to the first through the I-th memorized data bits, respectively, namely, to the respective original data bits. A controller 44 is a little different from that described in conjunction with FIG. 1 and is supplied from the circuit input terminal 11 with the control data 26 and 27 (FIG. 2) and with the successively received frames and controls the main and the auxiliary buffers 41 and 42 in the manner which will become clear as the description proceeds.

A logic operator 45 is considerably different from that described in connection with FIG. 1 and is connected to the circuit input terminal 11 through a frame input connection 46 and to the circuit output terminal 12 through a frame output connection 47. The logic operator 45 is connected to the main buffer 41 through a data output 51 and through a data input connection 52 and to the auxiliary buffer 42 through a value output connection 53 and a value input connection 54. Furthermore, the logic operator 45 is connected to the controller 44 through a bidirectional connection.

On describing the majority decision circuit more in detail, the second through the fifth received frames may collectively be called subsequently received frames. In this event, the majority decision circuit repeatedly receives the original frame five times as the first and the subsequently received frames.

Received at the circuit input terminal 11, the first received frame is sent by the controller 44 to the main buffer 41 through the frame input connection 46, the logic operator 45, and the data output connection 51. The first through the I-th received data bits of the first received frame are stored in the main buffer 41 as the first through the I-th memorized data bits, respectively, in the manner depicted at A(1), A(2), ..., A(i), ..., and A(I). Incidentally, the main buffer 41 need not be preliminarily cleared on memorizing the first through the I-th memorized data bits.

A combination of the controller 44, the logic operator 45, the frame input connection 46, and the data output connection 51 therefore serves as a storing section for storing the received data bits of the first received frame in the main buffer 41. The storing section is alternatively referred to as a zeroth value giving section or simply as a value giving section, which is connected to the main buffer 41 and supplied with the first received frame for giving the first through the I-th received data bits of the first received frame to the first through the I-th memorized data bits.

While received at the circuit input terminal 11 as a currently received frame, the second received frame of the successively received frames is delivered to the logic operator 45 through the frame input connection 46. When an i-th received data bit of the second received frame is supplied to the logic operator 45, the controller 44 makes the main buffer 41 supply the logic operator 45 through the data input connection 52 with an i-th memorized data bit, namely, an i-th received data bit of the first received frame under the circumstances.

If the i-th received data bit of the second received frame is identical with the i-th memorized data bit to have a common binary value, the logic operator 45 determines the common binary value as an i-th majority of the i-th memorized data bit and the i-th received data bit of the second received frame, namely, of two i-th received data bits of the first and the second received frames. In the meantime, the logic operator 45 produces a first logic value, which may have a logic zero level. The controller 44 stores the first logic value through the value input connection 53 in the auxiliary buffer 42 as an i-th auxiliary memorized bit. The controller 44 keeps the i-th memorized data bit in the main buffer 41 as it stands. Alternatively, it is possible to understand that the controller 44 updates the i-th memorized data bit to the i-th majority, namely, to the i-th received data bit of the second received frame. In other words, the i-th received data bit of the second received frame is substituted in the main buffer 41 for an i-th previous data bit had by the i-th memorized data bit immediately before the second received frame is received.

If the i-th received data bit of the second received frame is not identical with, namely, is different from, the i-th memorized data bit, the logic operator 45 can not determine the i-th majority. The controller 44 keeps the i-th memorized data bit untouched in the main buffer 41. The logic operator 45 produces a second logic value, which has a logic one level if the first logic value is logic zero. The controller 44 stores the second logic value through the value output connection 53 in the auxiliary buffer 42 as the i-th auxiliary memorized bit.

In this manner, the auxiliary buffer 42 is loaded with the first and/or the second logic values as the first through the I-th auxiliary memorized bits, which are depected at B(1). B(2), ..., B(i), ..., and B(I). The auxiliary buffer 42 need not be preliminarily cleared before the first through the I-th received data bits of the second received frame are successively supplied to the logic operator 45.

It will now be presumed that the third received frame is delivered to the logic operator 45 through the frame input connection 46. When an i-th received data bit of the third received frame is supplied to the logic operator 45, the controller 44 makes the main buffer 41 supply the logic operator 45 through the data input connection 52 with the i-th memorized data bit and makes the auxiliary buffer 42 supply the logic operator 45 through the value input connection 54 with the i-th auxiliary memorized bit.

It will first be assumed that the first logic value is memorized in the auxiliary buffer 42 as the i-th auxiliary memorized bit. If the i-th received data bit of the third received frame is identical with the i-th memorized data bit to have a common binary value, the logic operator 45 determines the common binary value as an i-th majority of three i-th received data bits of the first through the third received frames. If the i-th received data bit of the third received frame is not identical with the i-th memorized data bit, the i-th memorized data bit gives the i-th majority of two i-th received data bits of two of the first through the third received frames. In this event, the controller 44 keeps the i-th memorized data bit unchanged in the main buffer 41. The logic operator 45 produces the second logic value. The controller 44 updates through the value output connection 53 the i-th auxiliary memorized bit in the auxiliary buffer 42 to the second logic value.

It will next be assumed that the second logic value is memorized in the auxiliary buffer 42 as the i-th auxiliary memorized bit. In this event, the majority is not determined in connection with the two i-th received data bits of the first and the second received frames. If the i-th received data bit of the third received frame is identical with the i-th memorized data bit, the i-th memorized data bit gives a majority of the three i-th received data bits of the first through the third received frames. The controller 44 keeps in the main buffer 41 the i-th memorized data bit as it is. The logic operator 45 produces the second logic value. The controller 44 keeps the i-th auxiliary memorized bit at the second logic value. If the i-th received data bit of the third received frame is not identical with the i-th memorized data bit, this i-th received data bit gives a majority of the three i-th received data bits of the first through the third received frames. The controller 44 updates through the data output connection 51 the i-th memorized data bit to the i-th received data bit of the third received frames. The logic operator 45 produces the second logic value. The controller 44 leaves the i-th auxiliary memorized bit untouched in the auxiliary buffer 42.

The description will proceed to a case where the fourth received frame is delivered to the logic operator 45 through the frame input connection 46. When an i-th received data bit of the fourth received frame is supplied to the logic operator 45, the controller 44 makes the main buffer 41 supply the logic operator 45 through the data input connection 52 with the i-th memorized data bit and makes the auxiliary buffer 42 supply the logic operator 45 through the value input connection 54 with the i-th auxiliary memorized bit.

It will be assumed that the i-th auxiliary memorized bit has the first logic value. In this event, the i-th majority is already fixedly determined as regargs the three i-th received data bits of the first through the third received frames and consequently in connection with four i-th received data bits of the first through the fourth received frames even though the i-th received data bit of the fourth received frame may or may not be identical with the i-th memorized data bit. The logic operator 44 makes the controller 44 keep the i-th memorized data bit and the i-th auxiliary memorized bit as they stand.

It will now be assumed that the i-th auxiliary memorized bit has the second logic value. If the i-th received data bit of the fourth received frame is identical with the i-th memorized data bit, the i-th received data bit gives a majority of the four i-th received data bits of the first through the fourth received frames. The controller 44 keeps the i-th memorized data bit and the i-th auxiliary memorized bit as they are. If the i-th received data bit of the fourth received frame happens to be different from the i-th memorized data bit, two of the four i-th received data bits are different from two others of the four i-th received data bits. The majority is therefore not determined in connection with these four i-th received data bits. Under the circumstances, the logic operator 45 makes the controller 44 keep the second logic value in the auxiliary buffer 41 as the i-th auxiliary memorized bit as it stands.

It will now be presumed that the fifth received frame is finally delivered to the logic operator 45 through the frame input connection 46. When an i-th received data bit of the fifth received frame is supplied to the logic operator 45, the controller 44 makes the main buffer 41 supply the logic operator 45 through the data input connection 52 with the i-th memorized data bit and makes the auxiliary buffer 42 supply the logic operator 45 through the value input connection 54 with the i-th auxiliary memorized bit.

It will be assumed that the first logic value is memorized in the auxiliary buffer 42 as the i-th auxiliary memorized bit. In this event the majority is already fixedly determined in connection with the four i-th received data bits of the first through the fourth received frames and therefore as regards five i-th received data bits of the first through the fifth received frames even if the i-th received data bit of the fifth received frame may or may not be identical with the i-th memorized data bit. The logic operator 45 therefore makes the controller 44 keep the i-th memorized data bit and the i-th auxiliary memorized bit as they stand.

It will now be assumed that the i-th auxiliary memorized bit has the second logic value. In this event, no majority is determined in connection with the four i-th received data bits of the first through fourth received frames. The logic operator 45 therefore uses the i-th received data bit of the fifth received frame as an i-th majority of the five i-th received data bits. The controller 44 updates through the data output connection 51 the i-th memorized data bit to the i-th received data bit of the fifth received frame. The logic operator 45 may produce the first logic value. Such a logic value is, however, no more necessary. In other words, the controller 44 may leave the i-th auxiliary memorized bit untouched when the fifth received frame is delivered to the logic operator 45.

Either after the first through the I-th memorized data bits are updated in this manner or while updating or renewal proceeds in the main buffer 41 in connection with the fifth received frame, the controller 44 makes the main buffer 41 deliver the first through the I-th memorized data bits to the circuit output terminal 12 through the data output connection 52, the logic operator 45, and the frame output connection 47 as the first through the I-th resultant data bits of the resultant frame. In this manner, the first through the I-th resultant data bits are eventually memorized an the main buffer 41 as the first through the I-th memorized data bits and are delivered from the main buffer 41 to the circuit output terminal 12.

If implemented by hardware, it is convenient to use an I-stage shift register as each of the main and the auxiliary buffers 41 and 42. The shift register has a first stage connected to the data or the value output connection 51 or 53 and an I-th stage connected to the data or the value input connection 52 or 54. In this event, the controller 44 is controlled by the control data 26, 27, and 29 (FIG. 2) to simultaneously deliver a shift pulse sequence to the main and the auxiliary buffers 41 and 42 in a timed relationship to supply of the first through the I-th received data bits of the m-th received frame to the logic operator 45. When the data input connection 52 is supplied from the I-th stage with the i-th memorized data bit representative of a previous data bit given by the i-th received data bit of an (m−1)-th received frame, the i-th received data bit of the m-th received frame is delivered to the first stage through the data input connection 51 to be stored in the first stage as a new i-th memorized data bit.

At any rate, only two buffers 41 and 42 are necessary in marked contrast to five buffers 31 through 35 which are indispensable in the conventional majority decision circuit illustrated with reference to FIG. 1. Only one hundred and sixty flip-flops are necessary in the majority decision circuit being illustrated with reference to FIG. 3.

The first through the I-th received data bits of the m-th received frame will now be denoted by D(1(m)), D(2(m)), ..., D(i(m)), ..., and D(I(m)). Before these received data bits are stored in the main buffer 41 while the m-th received frame is currently received, the first through the I-th memorized data bits A(1) through A(I) are given previous data bits A(1(m−1)), A(2(m−1)), ..., A(i(m−1)), ..., and A(I(m−1)). When updated during reception of the m-th received frame by the logic operator 45, the first through the I-th memorized data bits A(1) through A(I) are given new data bits A(1(m)), A(2(m)), ..., A(i(m)), ..., and A(I(m)). Similarly, the auxiliary buffer 42 memorizes the first and/or the second logic values as previous logic values B(1(m−1)), B(2(m−1)), ..., B(i(m−1)), ..., and B(I(m−1)) before updated to new logic values B(1(m)), B(2(m)), ..., B(i(m)), ..., and B(I(m)) while the m-th received frame is currently received by the logic operator 45.

In cooperation with the controller 44, the logic operator 45 carries out a first operation in accordance with:

$$A(i(1)) = D(i(1)),$$

while supplied with the first received frame. The logic operator 45 carries out a second operation in compliance with:

$$A(i(2)) = A(i(1))$$

and $$B(i(2)) = A(i(1)) \oplus D(i(2)),$$

while supplied with the second received frame. The logic operator 45 carries out a third operation according to:

$$A(i(3)) = A(i(2)) \cdot \overline{B(i(2))} \cdot D(i(3))$$

and $$B(i(3)) = B(i(2)) \oplus A(i(2)) \oplus D(i(3)),$$

while supplied with the third received frame. The logic operator 45 carries out a fourth operation in compliance with:

$$A(i(4)) = A(i(3))$$

and $$B(i(4)) = B(i(3)) \cdot [A(i(3)) \oplus D(i(4))],$$

while supplied with the fourth received frame. The logic operator 45 carries out a fifth operation in response to:

$$A(i(5)) = A(i(4)) \cdot B(i(4)) + B(i(4)) \cdot D(i(5)),$$

while supplied with the fifth received frame. It is now readily possible to implement the logic operator 45 as by a microprocessor.

Summarizing, first through I-th majorities are memorized in the main buffer 41 as the first through the I-th memorized data bits if determined. The i-th auxiliary memorized bit has the first logic value in the auxiliary buffer 42 either if two i-th received data bits have a common binary value when only the first and the second received frames are received or if at least three i-th received data bits have a common binary value when at least three of the first through the fifth received frames are received by the logic operator 45. Otherwise, the i-th auxiliary memorized bit is given the second logic value.

It is now understood that a combination of the controller 44, the logic operator 45, the frame input and output connections 46 and 47, and the data and the value output and input connections 51 through 54 serves as a logic operation unit. Another combination of the value giving section (44–46, 51) and the logic operation unit (44–47, 51–54) serves as a logic operation section.

Connected to the main and the auxiliary buffers 41 and 42 and supplied with the successively received frames, the logic operation section (44–47, 51–54) carries out a logic operation on the memorized data bits and the auxiliary memorized bits in the manner which will shortly be described. Connected to the main and the auxiliary buffers 41 and 42 and supplied with the second and the subsequently received frames, the logic operation unit (44-47, 51-54) carries out a similar logic operation on the first through the I-th memorized data bits and the first through the I-th auxiliary memorized bits.

It is possible to describe the logic operation by directing attention to the memorized data bits by themselves. Under the circumstances, the logic operation section carries out the logic operation by first determining a majority of each of the memorized data bits, such as the i-th memorized data bit, and from one to four of the received data bits of each set to update the said each of the memorized data bits to the majority, wherein the above-mentioned from one to four of the received data bits of the set are in correspondence in the successively received frames to the said each of the memorized data bits, such as from one to four of the i-th received data bits of the successively received frames.

In the meantime, the first and the second logic values are given to each of the auxiliary memorized bits, such as the i-th auxiliary memorized bit, as follows, wherein this each of the auxiliary memorized bits is in correspondence to the said each of the memorized data bits. While only two of the successively received frames, namely, the first and the second received frames, are received, the logic operation section gives the first and the second logic values to the i-th auxiliary memorized bit when two of from one to five of the received data bits, such as the i-th received data bits of the first and the second received frames, are identical with each other and otherwise, respectively. While more than two of the successively received frames are received, the first and the second logic values are given to the i-th auxiliary memorized bit when at least three of the from one to five of the received data bits are identical with one another and otherwise, respectively. Finally, the memorized data bits and the auxiliary memorized bits are used in eventually updating the memorized data bits to the resultant data bits when the logic operation section is supplied with all of the successively received frames.

Alternatively, the logic operation section can be described with attention directed to various values given to the memorized data bits. Operation of the logic operation unit will be described from this point of view. In this connection, it should be noted that the value giving section (44-46, 51) preliminarily gives the first through the I-th received data bits of the first received frame to the first through the I-th memorized data bits while supplied with the first received frame.

While supplied with each of the second through the fifth received frames currently as a current frame, the logic operation unit determines the first through the I-th majorities in connection with the first through the I-th memorized data bits and the first through the I-th received data bits of the current frame in consideration of the first through the I-th auxiliary memorized bits. This fact will be taken into account in the following.

While supplied with the second received frame, the logic operation unit serves as a first value giving section. When an i(1)-th received data bit of the second received frame is and is not identical with an i(1)-th previous data bit had by an i(1)-th memorized data bit immediately before the second received frame is received, the first value giving section gives the first and the second logic values to an i(1)-th auxiliary memorized data bit, respectively, where i(1) is variable between 1 and the first predetermined integer, both inclusive. The i(1)-th received data bit is the i-th received data bit $D(i(2))$ mentioned before. The i(1)-th previous data bit is the i-th received data bit $D(i(1))$ which is preliminarily given to the i-th memorized data bit by the value giving section (44-46, 51).

While supplied with the third received frame, the logic operation unit serves as a second value giving section. When an i(2)-th received data bit of the third received frame is not identical with an i(2)-th previous data bit and furthermore when the first logic value is had by an i(2)-th auxiliary memorized bit, the second value giving section gives the second logic value to the i(2)-th auxiliary memorized bit and gives the i(2)-th received data bit to an i(2)-th memorized data bit, where i(2) is variable between 1 and the first predetermined integer, both inclusive. The i(2)-th previous data bit is what is had by the i(2)-th memorized data bit immediately before the third received frame is received. That is, the i(2)-th previous data bit is the i-th received data bit $D(i(2))$. In this manner, the second value giving section updates the i-th memorized data bit from the i(2)-th previous data bit to the i(2)-th received data bit and the first logic value to the second logic value at the i(2)-th auxiliary memorized bit.

While supplied with the fourth received frame, the logic operation unit serves as a third value giving section. When an i(3)-th received data bit of the fourth received frame is identical with an i(3)-th previous data bit had by an i(3)-th memorized data bit immediately before the fourth received frame is received, the third value giving section gives the first logic value to an i(3)-th auxiliary memorized bit, where i(3) is variable between 1 and the first predetermined integer, both inclusive. In this manner, the third value giving section updates the i(3)-th auxiliary memorized bit to the first logic value and insures the first logic value at the i(3)-th auxiliary memorized bit. The i(3)-th received data bit is the i-th received data bit $D(i(4))$ described above. The i(3)-th previous data bit is the i-th received data bit $D(i(3))$.

While supplied with the fifth received frame, the logic operation unit serves as a fourth value giving section. When an i(4)-th received data bit of the fifth received frame is not identical with an i(4)-th previous data bit and furthermore when the first logic value is had by an i(4)-th auxiliary memorized bit, the fourth value giving section gives the i(4)-th received data bit to an i(4)-th memorized data bit, where i(4) is variable between 1 and the first predetermined integer, both inclusive. The i(4)-th previous data bit is what is had by the i(4)-th memorized data bit immediately before the fifth received frame is received. The i(4)-th received data bit is the i-th received data bit $D(i(5))$. The i(4)-th previous data bit is the i-th received data bit $D(i(4))$. In this manner, the fourth value giving section updates the i(4)-th memorized data bit to the i-th received data bit $D(i(5))$.

In the manner described above, the fourth value giving section uses the first through the I-th received data bits of the fifth received frame. When the first through the I-th received data bits of the fifth received frame are all used, the fourth value giving section gives the first through the I-th resultant data bits by the first through the I-th memorized data bits which are eventually updated by using the first through the I-th received data bits of the second through the fifth received frames.

Referring now to FIG. 4, the description will proceed to a majority decision circuit according to a second embodiment of this invention. Similar parts are designated by like reference numerals and are operable with likewise named signals.

In FIG. 4, first through (N−1)-th counter buffers 42(1), 42(2), ..., and 42(N−1) are used instead of the auxiliary buffer 42 described in conjunction with FIG. 3, where N represents a second predetermined integer which is greater than two. It should be noted that the odd predetermined number M is not greater than $(2^{(N+1)}-3)$.

Connected to the logic operator 45, the controller 44 controls the first through the (N−1)-th counter buffers 42 (suffixes omitted) besides the main buffer 41 in the manner which will become clear as the description proceeds. The logic operator 45 is connected to an n-th counter buffer 42(n) of the first through the (N−1)-th counter buffers 42 through an n-th value output connection 53(n) and through an n-th value input connection 54(n), where n consecutively increases from one to the second predetermined integer less one.

The n-th counter buffer 42(n) is for memorozing first through I-th count bits B(1(n)), B(2(n)), ..., B(i(n)), ..., and B(I(n)) in correspondence to the first through the I-th memorized data bits A(1) to A(I), respectively, and consequently to the respective original data bits. In the example being illustrated, (N−1) i-th count bits B(i(1)) through B(i(N−1)) of the first through the (N−1)-th counter buffers 42 are used to represent least significant through most significant bits of an i-th binary number. In other words, the i-th count bits of the first through the (N−1)-th counter buffers 42 are used in collectively representing an i-th memorized count C(i). In this manner, the first through the (N−1)-th counter buffers 42 are used to represent in cooperation with one another first through I-th memorized counts C(1) to C(I). It is possible to understand without loss of generality that the i-th binary number is variable between zero and an i-th maximum count which is equal to $(2^{(N-1)}-1)$ and to a common maximum count had by the first through the I-th memorized counts C(1) to C(I).

A combination of the controller 44, the logic operator 45, the frame input connection 46, the data output connection 51, and the value output connections 53 (suffixes omitted) serves as a value giving section of the type described before. In the illustrated example, the value giving section (44–46, 51, 53) may alternatively be called an initializing section.

Connected to the main and the first through the (N−1)-th counter buffers 41 and 42 and supplied with the first received frame, the initializing section (44–46, 51, 53) gives the first through the I-th received data bits D(i(1)) to D(I(1)) to the first through the I-th memorized data bits A(1) to A(I) and an initial count to each of the first through the I-th memorized counts C(1) to C(I). It is convenient to use zero as the initial count. This is because the first through the (N−1)-th counter buffers 42 can only be reset to zero on initialization.

Another combination of the controller 44, the logic operator 45, the frame input and output connections 46 and 47, the data output and input connections 51 and 52, the value output connections 53, and the value input connections 54 (suffixes omitted) serves as a logic operation unit. Still another combination of the initializing section (44–46, 51, 53) and the logic operation unit (44–47, 51–54) serves as a logic operation section. While supplied with the second and the subsequently received frames, the logic operation section (44–47, 51–54) is operable like the logic operation unit.

Connected to the main and the first through the (N−1)-th counter buffers 41 and 42 and supplied with the second and the subsequently received frames, the logic operation unit carries out a logic operation on the first through the I-th memorized data bits and the first through the I-th memorized counts. The logic operation will be described in the following.

While supplied with the second received frame, the logic operation unit keeps an i-th previous data bit untouched as the i-th memorized data bit A(i) only when an i-th received data bit D(i(2)) of the second received frame is identical with the i-th previous data bit. In this case, the i-th previous data bit is what is had by the i-th memorized data bit immediately before the second received frame is received, namely, while the first received frame is received. That is, the i-th previous data bit is an i-th received data bit D(i(1)) of the first received frame and can be denoted by A(i(2−1)). It should be noted that a (1, i)-th majority is determined in this event in connection with two i-th received data bits D(i(1)) and D(i(2)) of the first and the second received frames.

When the (1, i)-th majority is determined in this manner, the logic operation unit adds one to an i-th previous count which is had by the i-th memorized count C(i) immediately before the second received frame is received. That is, the i-th previous count is the initial count under the circumstances and can be denoted by C(i(2−1)). The i-th previous count plus one may be called an i-th new count and denoted by C(i(2)).

Otherwise, the (1, i)-th majority is not determined. The logic operation unit retains the i-th previous data bit and the i-th previous count, namely, the initial count in this event, as the i-th memorized data bit A(i) and the i-th memorized count C(i) as they stand.

While the m-th received frame is received, an (m−1, i)-th majority is determined if possible. In the manner which will shortly be described, this majority is determined in connection with an i-th received data bit D(i(m)) of the m-th received frame and an i-th previous data bit A(i(m−1)) had by the i-th memorized data bit A(i) immediately before the m-th received frame is received, namely, while the (m−1)-th received frame is received. Incidentally, it is convenient depending on the circumstances to understand that m consecutively increases from one rather than from three. In such an event, the m-th received frame is referred to herein as an n-th received frame.

While the m-th received frame is received and if the m-th received frame is an odd-numbered frame among the subsequently received frames, an i-th previous count C(i(m−1)) is updated to the i-th previous count minus one only when the i-th received data bit D(i(m)) of the m-th received frame is not identical with the i-th previous data bit A(i(m−1)) and furthermore only when the initial count is not had by the i-th previous count. Otherwise, the i-th previous count is used as an i-th new count C(i(m)) as it is. Herein, the i-th previous count is what is had by the i-th memorized count C(i) immediately before the m-th received signal is received, namely, while the (m−1)-th received frame is received.

While the m-th received frame is an even-numbered frame of the subsequently received frames, the i-th previous count C(i(m−1)) is updated to the i-th previous count plus one only when the i-th received data bit of the m-th received frame is identical with the i-th previous data bit and furthermore only when the common maximum count is not had by the i-th previous count.

Otherwise, the i-th previous count is used as the i-th new count as it stands.

When whichever of the odd-numbered and the even-numbered frame is received as the m-th received frame, the i-th previous data bit A(i(m−1)) is updated to the i-th received data bit D(i(m)) of the m-th received frame only when the initial count is had by the i-th previous count. The i-th previous data bit is retained as an i-th new data bit A(i(m)) when the initial count is not had by the i-th previous count.

Attention will be directed to a time interval during which the m-th received frame is currently received as a current frame. It is understood from the above that the first through the I-th memorized data bits A(1) to A(I) of the main buffer 41 are given (m−1, i)-th through (m−1, I)-th majorities, an (m−1, i)-th majority of which is determined in connection with m i-th received data bits D(i(1)) to D(i(m)) of the first through the m-th received frames, namely, in connection with the i-th received data bit D(i(1)) of the first received frame as initially had by the i-th memorized data bit A(i) and (m−1) i-th received data bits D(i(2)) through D(i(m)) of an (m−1)-th partial set, which (m−1) i-th received data bits of the (m−1)-th partial set are in correspondence in the second through the m-th received frames to the i-th received data bit of the first received frame. If the m-th received frame is the even-numbered frame including the second received frame and furthermore if the (m−1, i)-th majority is not determined, whichever of an (m−2, i)-th majority and the i-th received data bit D(i(m)) of the m-th received frame may be given to the i-th memorized data bit. In the example described above, the (m−2, i)-th majority is used as the i-th memorized data bit.

It is possible to understand that the first through the I-th memorized counts C(1) to C(I) of the first through the (N−1)-th counter buffers 42 are updated in the meantime from (m, 1)-th through (m, I)-th previous counts C(1(m−1)) to C(I(m−1)) to (m, 1)-th through (m, I)-th new counts C(1(m)) to C(I(m)) while the m-th received frame is currently received as the current frame. In this connection, attention should be directed to the fact that the i-th received data bits D(i(m−1)) and D(i(m)) of the (m−1)-th and the m-th received frames have either a common binary value or different binary values. As a consequence, m i-th received data bits D(i(1)) through D(i(m)) of the first through the m-th received frames have the different binary values an even and an odd number of times when m is an even and an odd number, respectively, namely, when the m-th received frame is an even-numbered frame of the second and the subsequently received frames, such as the second received frame, and an odd-numbered frame of the subsequently received frame, such as the third received frame, respectively.

It is therefore possible to make the i-th memorized count C(i) represent a half of the number of times when zero is used as the initial count and when ½ is neglected. In order so to make the i-th memorized count represent a half, the first through the I-th memorized counts C(1) to C(I) are differently updated when the m-th received frame of the second and the subsequently received frames is the even-numbered and the odd-numbered frames. This enables the i-th memorized count C(i(m)) represent the common maximum count which is given by $2(2^{(N-1)}-1)$, namely, by $(2^{(N+1)}-3)$. The first through the (N−1)-th counter buffers 42 can deal with the first through the M-th received frames, where M is not greater than the common maximum count. Incidentally, the initial count corresponds to the second logic value described in conjunction with FIG. 3.

In the example being illustrated, the majority decision circuit comprises only N buffers 41 and 42 in total and can deal with up to $(2^{(N+1)}-3)$ received frames. It is readily understood that an unexpectedly reduced number of buffers 41 and 42 are used as compared with the buffers, such as 31 through 35, which are indispensable in the conventional majority decision circuit of the type illustrated with reference to FIG. 1.

Reviewing FIGS. 3 and 4, a combination of the main and either the auxiliary or the first through the (N−1)-th counter buffers 41 and 42, the value giving section (44–46, 51) or (44–46, 51, 53), and the logic operation unit (44–47, 51-54) serves as a first majority determining section when supplied with the first received frame and thereafter with the second received frame. The majority determining section (41, 42, 44–47, 51-54) is for determining a first partial majority, such as the (1, i)-th majority, of the received data bits of each first partial set. The received data bits of the first partial set are in correspondence to each other in the first and the second received frames, such as two i-th received data bits D(i(1)) and D(i(2)) of the first and the second received frames.

Connected to the first majority determining section and supplied with the third through the m-th received frames, the combination (41, 42, 44–47, 51-54) serves as a second majority determining section for determining an (m−1)-th partial majority of the first partial majority and the received data bit or bits of an (m−1)-th partial set. The received data bit or bits of the (m−1)-th partial set are in correspondence in the third through the m-th received frames to the received data bits of the first partial set, such as (m−2) i-th received data bit or bits D(i(3)) through D(i(m)) of the third through the m-th received frames. When m increases up to the odd predetermined number M, the (m−1)-th partial majority becomes the above-mentioned entire majority and gives one of the resultant data bits that is in correspondence to each of the received data bits of the (m−1)-th partial set.

The majority decision circuit is therefore for carrying out a majority decision method of determining, by receiving an odd predetermined number of times successively received frames, each comprising received data bits in correspondence to the received data bits of any one of others of the received frames, respectively, an entire majority of the received data bits of each entire set, which received data bits of the entire set are in correspondence to each other in the successively received frames. The majority decision method comprises the step of determining the entire majority while successively receiving the received frames.

More particularly, the odd predetermined number is not less than five. The successively received frames are therefore received as first, second, and third through M-th received frames, where M represents the odd predetermined number. The entire majority is determined, while the second received frame is currently received following the first received frame, a first partial majority of the received data bits of each first partial set, which received data bits of the first partial set are in correspondence to each other in the first and the second received frames.

Subsequently while an m-th received frame is currently received, where m consecutively increases from three to the odd predetermined number M, an (m−1)-th partial majority is determined in connection with the first partial majority and the received data bit or bits of an (m−1)-th partial set, which received data bit or bits of the (m−1)-th partial set are in correspondence in the third through the m-th received frames to the received data bits of the first partial set. The (m−1)-th partial majority becomes the entire majority when m increases up to the predetermined number M.

While this invention has thus far been described in specific conjunction with only two preferred embodiments thereof, it will now be readily possible for one skilled in the art to implement the majority decision circuit. For example, the logic operator 45 can be implemented as by a microprocessor for use in combination with the first through the (N−1)-th counter buffers 42. The controller 44 can likewise be implemented for use in connection with either the auxiliary buffer 42 or with the first through the (N−1)-th counter buffers 42.

It will furthermore be readily possible for one skilled in the art to put this invention into practice in various other manners. For example, the initial count may not have a common value, such as zero, for the first through the I-th binary numbers. Instead, the initial count may have first through I-th different initial values for the first through the I-th binary numbers. It should be noted in this connection that the maximum count becomes different in this event for the first through the I-th binary numbers. The logic operator 45 becomes somewhat complicated because the first through the I-th initial values and first through I-th maximum values must be individually detected in connection with the first through the I-th memorized counts C(1) to C(I). The i-th memorized count C(i) may represent the odd and the even number of times by themselves rather than a half of the number of times. In this event, the odd predetermined number M should not be greater than $(2^{(N-1)}-1)$. The logic operator 45 can be programmed simpler.

What is claimed is:

1. A majority decision method of determining, by an entire set of successively received frames, said entire set be constituted by receiving an odd predetermined number M, not less than five, of said successively received frames, an entire majority of the received data bits of each said entire set, each frame comprising received data bits in correspondence to the received data bits of another of said successively received frames, said entire majority decision method comprising the step of
    determining, while an m-th received frame is currently received, where m consecutively increases from one to said predetermined number M, an (m−1)-th partial majority of the received data bits of an (m−1)-th partial set which includes a part of said odd predetermined number of successively received frames, the received data bits of said (m−1)-th partial set being correspondence to the received data bits of said partial set in said first through said m-th received frames, said (m−1)-th partial majority becoming said entire majority when m becomes equal to said predetermined number.

2. A majority decision circuit for repeatedly receiving an original frame, comprising original data bits, an odd predetermined number M times as an entire set of first through M-th received frames, each frame comprising received data bits in correspondence to said original data bits, respectively, where M is not less than five, said majority decision circuit producing a resultant frame comprising resultant data bits in correspondence to said original data bits, respectively, said majority decision circuit comprising
    majority determining means supplied with an m-th received frame of said first through said M-th received frames for determining an (m−1)-th partial majority of the received data bits of an (m−1)-th partial set including a part of said entire set, the received data bits of said (m−1)-th partial set being in correspondence to the received data bit of said partial set in said first through m-th received frames, where m consecutively increases from one to said predetermined number M, said (m−1)-th partial majority giving one of said resultant data bits when m becomes equal to said predetermined number, said one of the resultant data bits being in correspondence to each of the received data bits of said (m−1)-th partial set.

3. A majority decision circuit as claimed in claim 2, wherein said predetermined number in equal to five and is less in number than the received data bits in each of said first through said M-th received frame.

4. A majority decision circuit as claimed in claim 2, wherein said predetermined number is greater than five and is less in number than the received data bits in each of said first through said M-th received frames.

5. A majority decision circuit for repeatedly receiving five times an original frame comprising original data bits as first, second, and subsequently received frames, each comprising first through I-th received data bits in correspondence to said original data bits, respectively, where I represents a predetermined integer, said majority decision circuit being for producing a resultant frame comprising first through I-th resultant data bits in correspondence to said original data bits, respectively, said majority decision circuit comprising:
    a main buffer for memorizing first through I-th memorized data bits in correspondence to said original data bits, respectively;
    an auxiliary buffer for memorizing first through I-th auxiliary memorized bits in correspondence to said original data bits, respectively;
    value giving means connected to said main buffer and supplied with said first received frame for giving the first through the I-th received data bits of said first received frame to said first through said I-th memorized data bits; and
    a logic operation unit connected to said main and said auxiliary buffers and supplied with said second and said subsequently received frames for carrying out a logic operation on said first through said I-th memorized data bits and said first through said I-th auxiliary memorized bits; by giving, while supplied with said second received frame, first and second logic values to an i-th auxiliary memorized bit when an i-th received data bit of said second received frame is and is not identical with an i-th previous data bit, respectively, where i is variable between 1 and said predetermined integer, both inclusive, said i-th previous data bit being had by an i-th memorized data bit immediately before said second received frame is received; by determining, while supplied with an m-th received frame, a majority of a j-th previous data bit and (m−1) j-th received data bits in each (m−1)-th partial set to update said j-th previous data bit to said majority and to give said first and said second logic values to a j-th auxiliary memorized bit when at least three of said j-th previous data bit and said (m−1) j-th received data bits of said (m−1)-th partial set are identical with one another and otherwise, respectively, where m consecutively increases from three to said predetermined number, j being variable between 1 and said predetermined integer, both inclusive, said j-th previous data bit being had by a j-th memorized data bit immediately before said m-th received frame is received; and by using said first through said I-th memorized data bits and said first through said I-th auxiliary memorized bits in eventually updating said first through said I-th memorized data bits to said first through said I-th resultant data bits when supplied with all of said subsequently received frames.

6. A majority decision circuit as claimed in claim 5, said subsequently received frames consisting of third, fourth, and fifth received frames, wherein said logic operation unit comprises:

first value giving means connected to said main and said auxiliary buffers and supplied with said second received frame for giving, when an i(1)-th received data bit of said second received frame is and is not identical with an i(1)-th previous data bit had by an i(1)-th memorized data bit immediately before said second received frame is received, said first and said second logic values to an i(1)-th auxiliary memorized bit, respectively, where i(1) is variable between 1 and said predetermined integer, both inclusive;

second value giving means connected to said main and said auxiliary buffers and supplied with said third received frame for giving, when an i(2)-th received data bit of said third received frame in not identical with an i(2)-th previous data bit and furthermore when said first logic value is had by an i(2)-th auxiliary memorized bit, said second logic value to said i(2)-th auxiliary memorized bit and said i(2)-th received data bit to an i(2)-th memorized data bit, where i(2) is variable between 1 and said predetermined integer, both inclusive, said i(2)-th previous data bit being had by said i(2)-th memorized data bit immediately before said third received frame is received;

third value giving means connected to said main and said auxiliary buffers and supplied with said fourth received frame for giving, when an i(3)-th received data bit of said fourth received frame is identical with an i(3)-th previous data bit had by an i(3)-th memorized data bit immediately before said fourth received frame is received, said first logic value to an i(3)-th auxiliary memorized bit, where i(3) is variable between 1 and said predetermined integer, both inclusive; and fourth value giving means connected to said main and said auxiliary buffers and supplied with said fifth received frame for giving, when an i(4)-th received data bit of said fifth received frame is not identical with an i(4)-th previous data bit and furthermore when said first logic value is had by an i(4)-th auxiliary memorized bit, said i(4)-th received data bit to an i(4)-th memorized data bit, where i(4) is variable between 1 and said predetermined integer, both inclusive, said i(4)-th previous data bit being had by said i(4)-th memorized data bit immediately before said fifth received frame is received, said fourth value giving means being for giving said first through said I-th resultant data bits by the first through the I-th memorized data bits which are updated by using the first through the I-th received data bits of said fifth received frame.

7. A majority decision circuit for repeatedly receiving an odd predetermined number of times an original frame comprising original data bits as first, second, and subsequently received frames, each comprising first through I-th received data bits in correspondence to said original data bits, respectively, where I represents a first predetermined integer which is greater than said odd predetermined number, said majority decision circuit being for producing a resultant frame comprising first through I-th resultant data bits in correspondence to said original data bits, respectively, said majority decision circuit comprising:

a main buffer for memorizing first through I-th memorized data bits in correspondence to said original data bits, respectively;

first through (N−1)-th counter buffers, an n-th counter buffer being for memorizing first through I-th count bits in correspondence to said original data bits, respectively, where N represents a second predetermined integer which is greater than two, n consecutively increasing from one to said second predetermined integer less one, said odd predetermined number being not greater than $(2^{(N+1)}-3)$, i-th count bits of said first through said (N−1)-th counter buffers collectively representing an i-th memorized count among first through I-th memorized counts, where i is variable between 1 and said first predetermined integer, both inclusive; and logic operation means connected to said main and said first through said (N−1)-th counter buffers and supplied with said first, said and second, and said subsequently received frames for carrying out a logic operation on said first through said I-th memorized data bits and said first through said I-th memorized counts to determine, while supplied with an n-th received frame, a majority of n i-th received data bits of said first through said n-th received frames; by giving, while supplied with said first received frame, the first through the I-th received data bits of said first received frame to said first through said I-th memorized data bits and an initial count to each of said first through said I-th memorized counts; by giving, while supplied with said second received frame, an i-th received data bit of said second received frame to an i-th memorized data bit and said initial count plus one to an i-th memorized count only when the i-th received data bit of said second received frame is not identical with an i-th received data bit of said first received frame; by updating, while supplied with an odd-numbered frame among said subsequently received frames as said n-th received frame, an i-th previous count to said i-th previous count minus one only when an i-th received data bit of said n-th received frame is not identical with an i-th previous data bit and furthermore only when said initial count is not had by said i-th previous count, said i-th previous data bit being had by said i-th memorized data bit immediately before said n-th received frame is received; by updating, while supplied with an even-numbered frame among said subsequently received frames as said n-th received frame, said i-th previous count to said i-th previous count plus one only when the i-th received data bit of said n-th received frame is identical with said i-th previous data bit and furthermore only when a common maximum of said first through said i-th memorized counts is not had by said i-th previous count; by updating, while supplied with whichever of said odd-numbered and said even-numbered frames as said n-th received frame, said i-th previous data bit to the i-th received data bit of said n-th received frame only when said initial count is had by said i-th previous count; and by using said first through said I-th memorized data bits and said first through said I-th memorized counts in eventually updating said first through said I-th memorized data bits to said first through said I-th resultant data bits when supplied with all of said subsequently received frames.

8. A majority decision circuit as claimed in claim 7, wherein said logic operation means comprises:

value giving means connected to said main and said first through said $(N-1)$-th counter buffers and supplied with said first received frame for giving the first through the I-th received data bits of said first received frame to said first through said I-th memorized data bits and said initial count to each of said first through said I-th memorized counts; and a logic operation unit connected to said main and said first through said $(N-1)$-th counter buffers and supplied with said second and said subsequently received frames for carrying out said logic operation of determining, while supplied with said n-th received frame, the majority of the i-th received data bit of said first received frame as had by said i-th memorized data bit and $(n-1)$ i-th received data bits of said second through said n-th received frames; by giving while supplied with said second received frame, the i-th received data bit of said second received frame to said i-th memorized data bit and said initial count plus one to said i-th memorized count only when the i-th received data bit of said second received frame is not identical with the i-th received data bit of said first received frame; by updating, while supplied with said odd-numbered frame as said n-th received frame, said i-th previous count to said i-th previous count minus one only when said i-th received bit of said n-th received frame is not identical with said i-th previous data bit and furthermore only when said initial count is not had by said i-th previous count; by updating, while supplied with said even-numbered frame as said n-th received frame, said i-th previous count to said i-th previous count plus one only when the i-th received data bit of said n-th received frame is identical with said i-th previous data bit and furthermore only when said common maximum is not had by said i-th previous count; by updating, while supplied with whichever of said odd-numbered and said even-numbered frames as said n-th received frame, said i-th previous data bit to the i-th received data bit of said n-th received frame only when said initial count is had by said i-th previous count; and by using said first through said I-th memorized data bits and said first through said I-th memorized counts in eventually updating said first through said I-th memorized data bits to said first through said I-th resultant data bits when supplied with all of said subsequently received frames.

* * * * *